(12) United States Patent
Na

(10) Patent No.: US 7,317,337 B2
(45) Date of Patent: Jan. 8, 2008

(54) OUTPUT DRIVER IN SEMICONDUCTOR DEVICE

(75) Inventor: Kwang-Jin Na, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 73 days.

(21) Appl. No.: 11/323,584

(22) Filed: Dec. 29, 2005

(65) Prior Publication Data
US 2007/0008006 A1    Jan. 11, 2007

(30) Foreign Application Priority Data
Jun. 29, 2005    (KR) ...................... 10-2005-0057001

(51) Int. Cl.
*H03K 19/0175* (2006.01)
(52) U.S. Cl. .......................... 326/83; 326/86
(58) Field of Classification Search ................... 326/26, 326/27, 82–87
See application file for complete search history.

(56) References Cited

U.S. PATENT DOCUMENTS

| | | | |
|---|---|---|---|
| 5,650,736 A | 7/1997 | Pun et al. | |
| 6,047,346 A | 4/2000 | Lau et al. | |
| 6,236,245 B1* | 5/2001 | Papaliolios | 327/108 |
| 6,353,346 B1 | 3/2002 | Chan | |
| 6,466,063 B2 | 10/2002 | Chen | |
| 6,549,036 B1* | 4/2003 | Lee | 326/83 |
| 6,710,617 B2* | 3/2004 | Humphrey | 326/30 |
| 6,970,015 B1* | 11/2005 | Chan et al. | 326/82 |
| 2006/0220674 A1* | 10/2006 | Yeung et al. | 326/29 |
| 2007/0075745 A1* | 4/2007 | Song et al. | 326/83 |

FOREIGN PATENT DOCUMENTS

| | | |
|---|---|---|
| JP | 2002-224023 | 8/2000 |
| JP | 2001-68986 | 3/2001 |

* cited by examiner

*Primary Examiner*—Don Le
(74) *Attorney, Agent, or Firm*—Blakely, Sokoloff, Taylor & Zafman

(57) ABSTRACT

There is provided an output driver of a semiconductor device in which a slew rate variance is small despite an environmental change and a slew rate can be easily controlled. The output driver includes a main driver for driving an output terminal, a delay unit for controlling a delay time of a driving control signal in response to a delay control signal, and a pre-driver for pre-driving an input terminal of the main driver in response to an output signal of the delay unit.

12 Claims, 3 Drawing Sheets

OUTPUT DRIVER IN SEMICONDUCTOR DEVICE

FIELD OF THE INVENTION

The present invention relates to a design technology of a semiconductor circuit; and more particularly, to an output driver in a semiconductor device.

DESCRIPTION OF RELATED ART

A semiconductor memory device is fabricated based on various semiconductor technologies such as a processing technology of a silicon wafer and a logic design technology and so forth. A final product achieved through a semiconductor fabrication process is a plastic package typed chip, which retains a predetermined logic and function differentiated according to a purpose of use. Most of semiconductor chips are mounted on a printed circuit board, which is an important element for constituting a semiconductor system, and they need a predetermined driving voltage for operation.

Whole the semiconductor devices including a semiconductor memory device are operated by input/output of signals of which each signal has its own specific purpose. That is, whether the semiconductor device is operated or not and an operation mode of the semiconductor device, are determined by a combination of the input signals and the resultants are outputted according to states of the output signals. Meanwhile, an output signal of one semiconductor device may be used for an input signal of another semiconductor device.

FIG. 1 is a circuit diagram setting forth a conventional output driver in a semiconductor device.

Referring to FIG. 1, the conventional output driver includes a main driver 14 having a pull-up PMOS transistor P1 and a pull-down NMOS transistor N1, a pull-up pre-driver 10 for pre-driving a gate terminal of the pull-up PMOS transistor P1 in response to a pull-up control signal upz, and a pull-down pre-driver 12 for pre-driving a gate terminal of the pull-down NMOS transistor N1 in response to a pull-down control signal dnz. Herein, a source and a drain of the pull-up PMOS transistor P1 are connected to a power voltage terminal VDD and an output terminal OUT, and a source and a drain of the pull-down NMOS transistor N1 are connected to a ground voltage terminal VSS and the output terminal OUT.

Meanwhile, as an operational voltage for the semiconductor device becomes lower and lower while an operational speed becomes faster and faster, a performance of the output driver is looming large as an important factor with regard to a signal integrity. This is caused because a voltage level and a slew rate of the output data are mainly determined by the output driver. In particular, the slew rate of the output driver is very important factor in view of a channel noise.

According to the conventional output driver as described above, in order to control the slew rate, there is employed a method for controlling a load value by connecting a plurality of dummy capacitors C1, C2, C3 and C4 to front/rear ends of the pull-up pre-driver 10 and the pull-down pre-driver 12.

However, in case of using this method, it is difficult to control a slew rate variance of the output driver because the slew rate is severely changed as a capacitance of the dummy capacitor is varied with an environmental change.

SUMMARY OF THE INVENTION

It is, therefore, an object of the present invention to provide an output driver of a semiconductor device in which a slew rate variance is small despite an environmental change and a slew rate can be easily controlled.

In accordance with an aspect of the present invention, there is provided an output driver in a semiconductor device, including: a main driver for driving an output terminal; a delay unit for controlling a delay time of a driving control signal in response to a delay control signal; and a pre-driver for pre-driving an input terminal of the main driver in response to an output signal of the delay unit.

In accordance with another aspect of the present invention, there is provided an output driver in a semiconductor device, including: a pull-up driver for pulling up an output terminal; a pull-down driver for pulling down an output terminal; a pull-up delay unit for controlling a delay time of a pull-up control signal in response to a pull-up delay control signal; a pull-down delay unit for controlling a delay time of a pull-down control signal in response to a pull-down delay control signal; a pull-up pre-driver for pre-driving an input terminal of the pull-up driver in response to the output signal of the pull-up delay unit; and a pull-down pre-driver for pre-driving an input terminal of the pull-down driver in response to the output signal of the pull-down delay unit.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
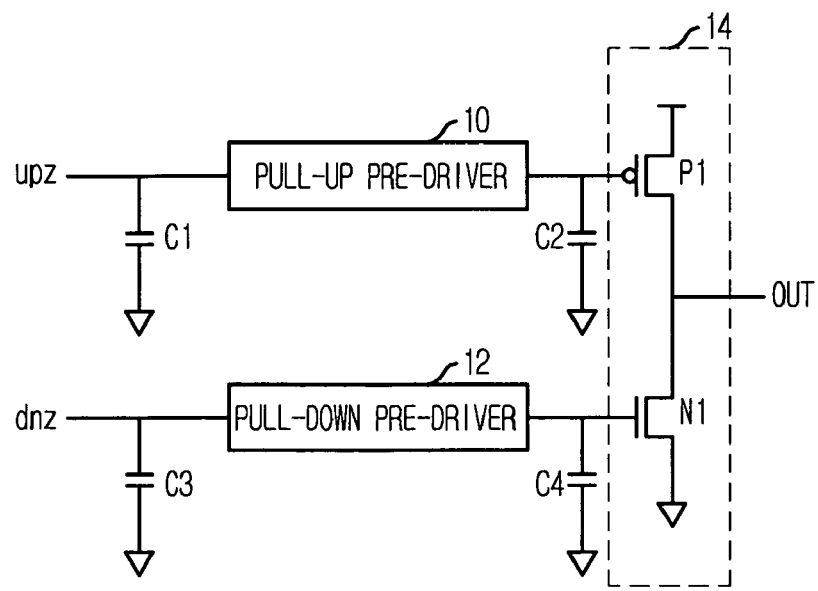
FIG. 1 is a circuit diagram setting forth an output driver of a conventional semiconductor device.
Figure 2:
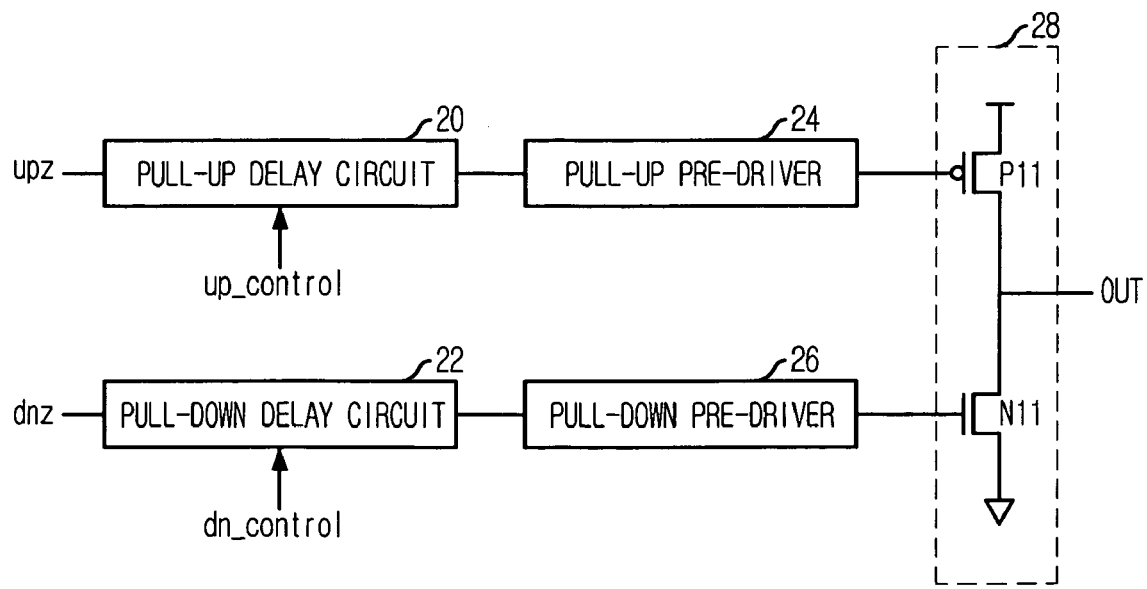
FIG. 2 is a circuit diagram illustrating an output driver according to one embodiment of the present invention.

FIG. 2 is a circuit diagram of an output drive in accordance with one embodiment of the present invention.

Referring to FIG. 2, the output driver of the present invention includes a main driver 28 having a pull-up PMOS transistor P11 and a pull-down NMOS transistor N11, a pull-up delay circuit 20 for controlling a delay time of a pull-up signal upz in response to a pull-up delay control signal up_control, a pull-down delay circuit 22 for controlling a delay time of a pull-down control signal dnz in response to a pull-down delay control signal dn_control, a pull-up pre-driver 24 for pre-driving a gate terminal of the pull-up PMOS transistor P11 in response to an output signal of the pull-up delay circuit 20, and a pull-down pre-driver 26 for pre-driving a gate terminal of the pull-down NMOS transistor N11 in response to an output signal of the pull-down delay circuit 22. Herein, a source and a drain of the pull-up PMOS transistor P11 are connected to a power voltage terminal VDD and an output terminal OUT, and a source and a drain of the pull-down NMOS transistor N11 are connected to a ground voltage terminal VSS and an output terminal OUT.

Figure 3:
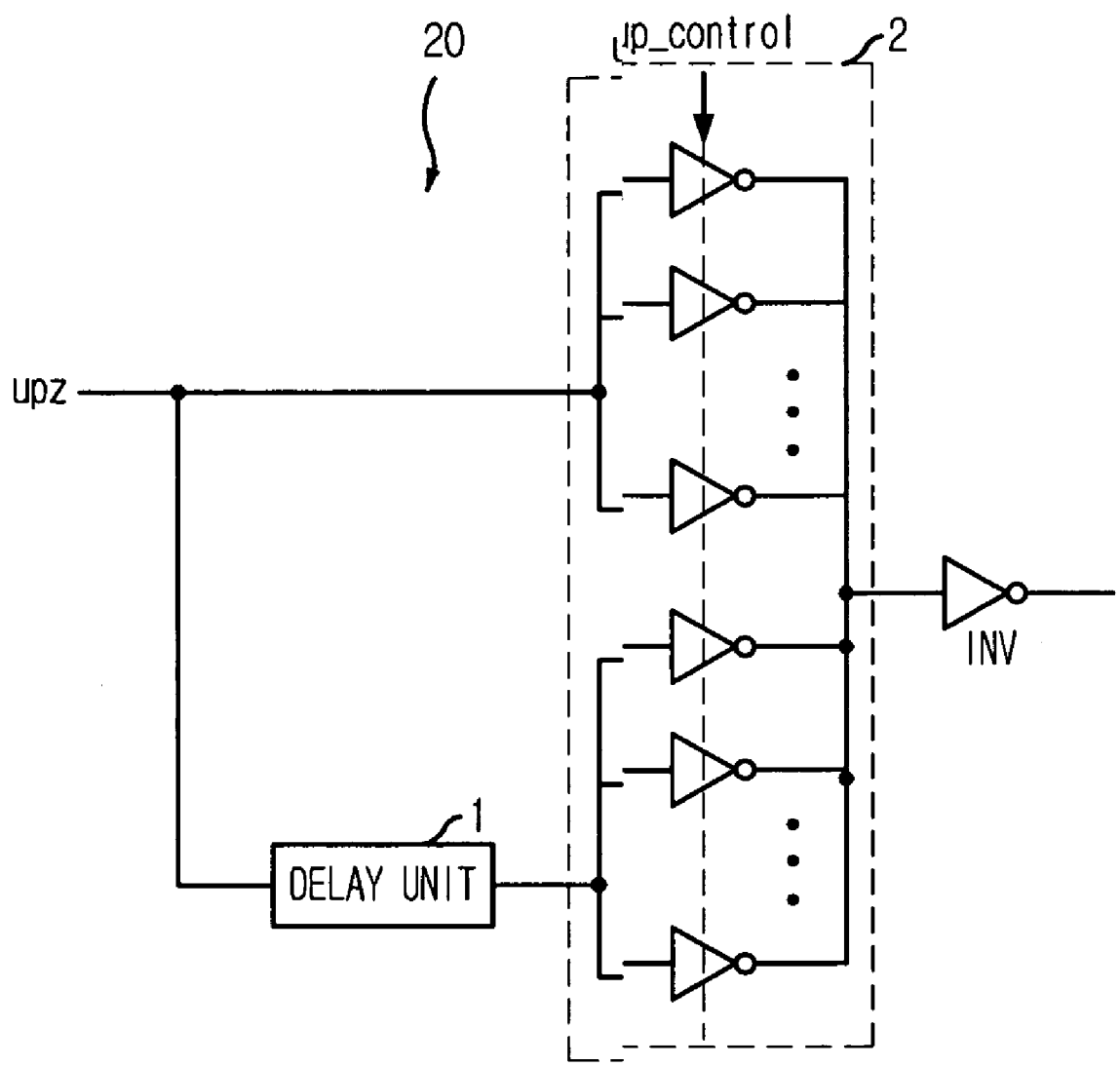
FIG. 3 is a detail circuit diagram representing the pull-up delay circuit of FIG. 2.

FIG. 3 is a detail circuit diagram setting forth the pull-up delay circuit 20 of FIG. 3.

Referring to FIG. 3, the pull-up delay circuit 20 is provided with a delay unit 1 for delaying the pull-up control signal upz by a predetermined delay time, a digital mixing unit 2 for adding a predetermined weight on phases of the pull-up control signal upz and the output signal of the delay unit 1 and mixing them in response to the pull-up delay control signal up_control, and an inverter INV for inverting the output signal of the digital mixing unit 2.

Herein, the digital mixing unit 2 has a plurality of inverters (hereinafter, referred to as a first inverter group) connected to one another in parallel which receive the pull-up control signal upz in common, and a plurality of inverters (hereinafter, referred to as a second inverter group) connected to one another in parallel which receive the output signal of the delay unit 1. The first inverter group and the second inverter group are enabled or disabled in response to a logic level of the pull-up delay control signal up_control. Here, it is preferable that the number of the inverter incorporated in each of the first and the second inverter groups should be equal as N, where N is a positive integer of 2 or more. In this case, the total number of the inverter in the first and the second groups enabled in response to the pull-up delay control signal becomes always N. It is preferable that a size of every inverter in the first and the second inverter groups should be identical to one another.

Meanwhile, a constitution of the pull-down delay circuit 22 of FIG. 2 may be configured with the same constitution of the pull-up delay circuit 20 depicted in FIG. 2.

Figure 4:
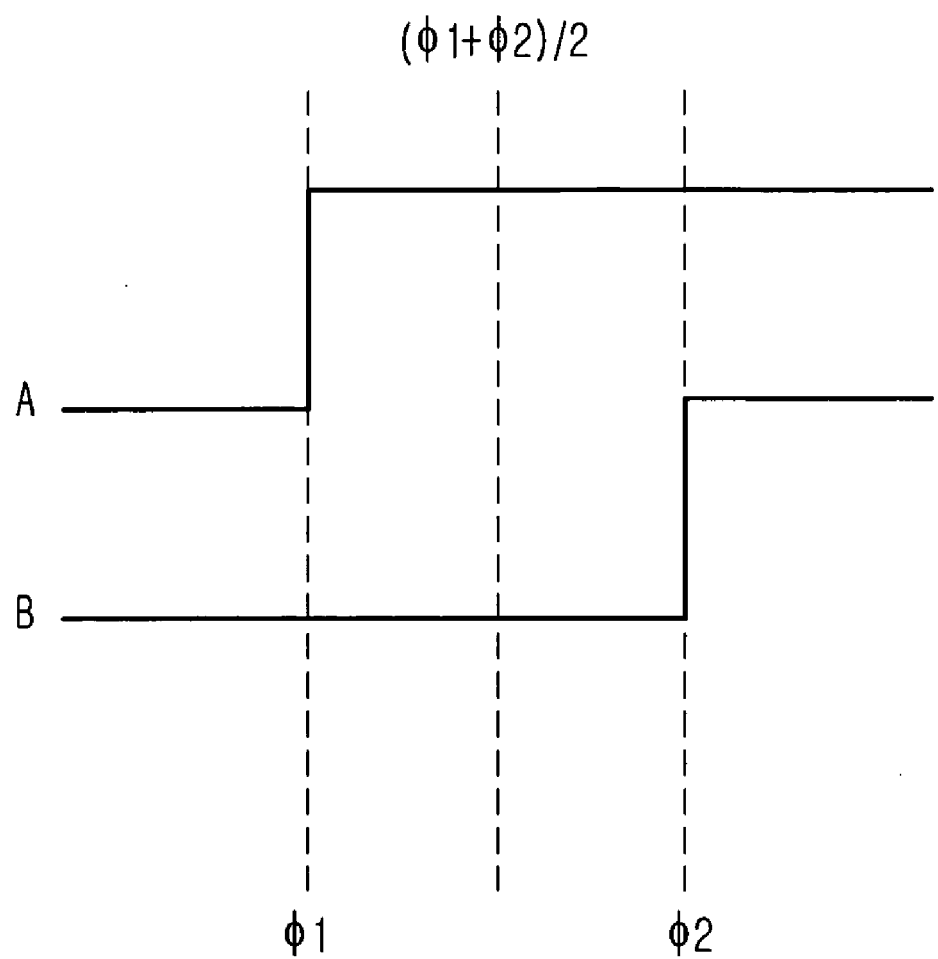
FIG. 4 is a waveform diagram explaining an operation of the digital mixing unit of FIG. 3.

FIG. 4 is a waveform diagram setting forth an operation of the digital mixing unit 2 of FIG. 3.

Referring to FIG. 4, it is assumed that a common input signal is A in the first inverter group of the digital mixing unit 2 and a common input signal is B in the second inverter group. The input signal B is a delayed signal of the input signal A so that if a phase of the input signal A is $\Phi 1$, a phase of the input signal B becomes $\Phi 2$ which lags behind.

Provided that six number of inverters are arranged in the first and the second inverter groups respectively, the number of the inverter enabled by the control signal becomes 6 also. Therefore, a mixing weight is determined and added according as how the inverters enabled by the control signal are arranged in the first and the second inverter groups. For example, in case that three inverters are enabled in the first and the second inverter groups respectively, the output signal of the digital mixing unit 2 has a half phase between the phase $\Phi 1$ of the input signal A and the phase $\Phi 2$ of the input signal B, i.e., $(\Phi 1+\Phi 2)/2$, because the weight is equal to the inverters. In addition, since the mixing weight is added on the input signal A provided that the number of the enabled inverters in the first inverter group is more than the second inverter group, the output signal of the digital mixing unit 2 has a phase relatively biased toward the phase $\Phi 1$ of the input signal A which is higher than the half phase $(\Phi 1+\Phi 2)/2$.

The delay time of the pull-up control signal upz may be controlled precisely by using the method aforementioned. In this case, as N becomes higher and higher, it is possible to control the delay time more precisely.

Meanwhile, the output driver including the pull-up delay circuit 20 and the pull-down delay circuit 22 allows the delay times of the pull-up control signal upz and the pull-down control signal dnz to be precisely controlled through the pull-up delay circuit 20 and the pull-down delay circuit 22. Through controlling the delay times of the pull-up control signal upz and the pull-down control signal dnz, it is possible to control the time for turning on/off the pull-up PMOS transistor P11 and the pull-down NMOS transistor N11 independently. This means that it is possible to control a time period that the pull-up PMOS transistor P11 and the pull-down NMOS transistor N11 are simultaneously turned on/off for a predetermined time. It is possible to precisely control the slew rate of the output driver in virtue of the above operations.

Besides, it is possible to easily embody the pull-up delay control signal up_control and the pull-down delay control signal dn_control for controlling the delay times of the pull-up delay circuit 20 and the pull-down delay circuit 22, by using a test mode or a fuse option. In comparison with the conventional method that the dummy capacitors are used for controlling the slew rate through the control of the load value, the slew rate variance with the environmental change is small and the slew rate can be easily controlled.

Furthermore, in comparison with the conventional output driver, the present invention is effective for controlling the slew rate of the output driver with ease and reducing the slew rate variance with the environmental change, which results in securing a noise property of the semiconductor device.

The present application contains subject matter related to Korean patent application No. 2005-57001, filed in the Korean Intellectual Property Office on Jun. 29, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

For instance, although it is illustrated in the above embodiment that the time for turning on/off the pull-up driver and the pull-down driver is controlled by applying the delay circuit to the pull-up control signal and the pull-down control signal respectively, the present invention may be applied to the case that the delay circuit is applied to only the pull-up or the pull-down control signal.

In addition, the delay circuit illustrated in the embodiment may be configured with another delay circuit capable of controlling the delay time with the control signal.

What is claimed is:

1. An output driver in a semiconductor device, comprising:
   a main driving means for driving an output terminal;
   a delay means for controlling a delay time of a driving control signal in response to a delay control signal; and
   a pre-driving means for pre-driving an input terminal of the main driving means in response to an output signal of the delay means, wherein the output signal from the delay means is generated by the driving control signal and a delayed driving control signal.

2. The output driver as recited in claim 1, wherein the delay means includes:
   a delay unit for delaying the driving control signal by a predetermined delay time;
   a digital mixing unit for adding a weight on phases of the driving control signal and the output signal of the delay unit and mixing them in response to the delay control signal; and
   a driver for driving the output signal of the digital mixing unit.

3. The output driver as recited in claim 2, wherein the digital mixing unit includes:
   a first inverter group configured with a plurality of inverters connected to one another in parallel, receiving the driving control signal in common; and a second inverter group configured with a plurality of inverters connected to one another in parallel, receiving the output signal of the delay unit in common, wherein each inverter in the first and the second inverter groups is enabled/disabled by the delay control signal.

4. The output driver as recited in claim 3, wherein a size of each inverter in the first and the second inverter groups is substantially identical to one another.

5. The output driver as recited in claim 1, wherein the delay control signal is generated based on one of a fuse option and an enabled test signal during a test mode.

6. An output driver in a semiconductor device, comprising:
   a pull-up driving means for pulling up an output terminal;
   a pull-down driving means for pulling down an output terminal;
   a pull-up delay means for controlling a delay time of a pull-up control signal in response to a pull-up delay control signal;
   a pull-down delay means for controlling a delay time of a pull-down control signal in response to a pull-down delay control signal;
   a pull-up pre-driving means for pre-driving an input terminal of the pull-up driving means in response to the output signal of the pull-up delay means; and
   a pull-down pre-driving means for pre-driving an input terminal of the pull-down driving means in response to the output signal of the pull-down delay means.

7. The output driver as recited in claim 6, wherein the pull-up delay means includes:
   a first delay unit for delaying the pull-up control signal by a predetermined delay time;
   a first digital mixing unit for adding a weight on phases of the pull-up control signal and the output signal of the first delay unit in response to the pull-up delay control signal; and
   a first inverter for inverting the output signal of the first digital mixing unit.

8. The output driver as recited in claim 7, wherein the pull-down delay means includes:
   a second delay unit for delaying the pull-down control signal by a predetermined delay time;
   a second digital mixing unit for adding a weight on phases of the pull-down control signal and the output signal of the second delay unit in response to the pull-down delay control signal; and
   a second inverter for inverting the output signal of the second digital mixing unit.

9. The output driver as recited in claim 8, wherein the first digital mixing unit includes:
   a first inverter group configured with a plurality of inverters connected to one another in parallel, receiving the pull-up control signal in common; and
   a second inverter group configured with a plurality of inverters connected to one another in parallel, receiving the output signal of the first delay unit in common,
   wherein each inverter in the first and the second inverter groups is enabled/disabled by the delay control signal.

10. The output driver as recited in claim 9, wherein the second digital mixing unit includes:
    a third inverter group configured with a plurality of inverters connected to one another in parallel, receiving the pull-down control signal in common; and
    a fourth inverter group configured with a plurality of inverters connected to one another in parallel, receiving the output signal of the second delay unit in common,
    wherein each inverter in the third and the fourth inverter groups is enabled/disabled by the delay control signal.

11. The output driver of claim 10, wherein a size of each inverter in the first to the fourth inverter groups is substantially identical to one another.

12. The output driver of claim 6, wherein the pull-up delay control signal and the pull-down delay control signal are generated based on one of a fuse option and an enabled test signal during a test mode.

* * * * *